United States Patent [19]

Fritz

[11] Patent Number: 4,474,639

[45] Date of Patent: Oct. 2, 1984

[54] METHOD AND DEVICE FOR PROCESSING INDIVIDUAL INTEGRATED CIRCUITS INTO FILM-MOUNTED, INTEGRATED CIRCUITS (MICROPACKS)

[75] Inventor: Otmar Fritz, Neukeferloh, Fed. Rep. of Germany

[73] Assignee: Siemens Aktiengesellschaft, Berlin & Munich, Fed. Rep. of Germany

[21] Appl. No.: 524,440

[22] Filed: Aug. 18, 1983

[30] Foreign Application Priority Data

Sep. 20, 1982 [DE] Fed. Rep. of Germany ....... 3244744

[51] Int. Cl.³ .............................................. B01J 17/00
[52] U.S. Cl. ..................................... 156/556; 29/740;
29/577 C; 29/589; 156/299; 156/562
[58] Field of Search ......................... 29/740, 589, 577;
156/556, 566, 562, 299

[56] References Cited

U.S. PATENT DOCUMENTS

| 3,634,930 | 1/1972 | Cranston | 29/589 X |
| 3,689,955 | 9/1972 | Nier | 29/589 X |
| 3,859,723 | 1/1975 | Hamer et al. | 29/740 X |
| 3,887,996 | 6/1975 | Hartleroad | 29/740 X |
| 3,931,922 | 1/1976 | Jackson | 29/589 X |

Primary Examiner—David Simmons
Attorney, Agent, or Firm—Hill, Van Santen, Steadman & Simpson

[57] ABSTRACT

For the purpose of processing individual, integrated circuits into film-mounted, integrated circuits (micropacks), a plate having recesses exhibiting the size of the individual chips disposed matrix-like is secured to a highly plane-parallel carrier plate consisting of material exhibiting poor thermal conductivity, the individual chips are placed in the recess of said plate, and the overall arrangement is further processed in an automatic contacting machine in a known manner.

12 Claims, 5 Drawing Figures

METHOD AND DEVICE FOR PROCESSING INDIVIDUAL INTEGRATED CIRCUITS INTO FILM-MOUNTED, INTEGRATED CIRCUITS (MICROPACKS)

BACKGROUND OF THE INVENTION

1. Field of the Invention

The present invention relates to a method and device for processing individual integrated circuits and more particularly to a matrix plate for holding the integrated circuits during processing by automatic machines.

2. Description of the Prior Art

In the standard method for assembling integrated circuits provided with connecting bumps into film-mounted integrated circuits (micropacks), an individual wafer containing the integrated circuits is waxed onto a carrier plate and is sawed into individual chips. The carrier with what are then the individual chips which are exactly fixed by the wax layer in their original position prescribed by the wafer is placed at the inner lead bonder on an X-Y-displaceable table and the good chips are further processed directly from the carrier, i.e., are contacted to the terminal legs of the so-called film spiders.

Problems have been revealed given this known method, particularly given multi-pole, large-surface chips. As a result, for example, of the small distance of the rows of connecting bumps from chips adjacent in the wafer, the danger exists that the connecting legs of a film spider will come into contact with the connecting bumps of an adjacent chip and will likewise be soldered there. Moreover, agreement cannot be reached with all manufacturers of such circuits that the circuits be supplied in the form of complete wafers since wafers supplied undivided would provide the user with information concerning the yield of good chips.

SUMMARY OF THE INVENTION

It is therefore an object of the present invention to provide a method and a device with which individual, integrated circuits (chips) can also be further processed in micropacks in automatic contacting machines normally provided for wafer processing. This is inventively achieved in that a plate having matrix-like recesses of the size of the individual chips is secured to a very level planar carrier plate consisting of material exhibiting poor thermal conductivity, in that the individual chips are placed in the recesses of said plate and, subsequently, the overall arrangement is inserted into an automatic contacting machine and is further processed there in a known manner.

The advantage of this inventive measure is that individual chips, just like the known carrier plates with chips waxed on, can also be processed in a standard automatic contacting machine for producing the inner lead contacting of micropacks.

BRIEF DESCRIPTION OF THE DRAWINGS

Further details of the invention derive from the description of an advantageous sample embodiment provided on the basis of the Figures, whereby.

DESCRIPTION OF THE PREFERRED EMBODIMENTS

Figure 1:
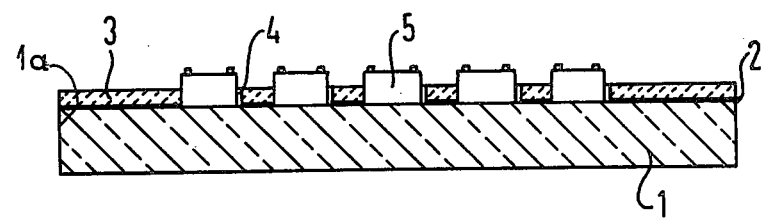
FIG. 1 is a side sectional view through the inventive device.

FIG. 1 shows a section through an inventive device, whereby a carrier plate 1 with a very level planar upper face 1a, a matrix plate 3 having recesses 4 arranged matrix-like, and the disposition of individual chips 5 in the recesses of the plate can, in particular, be seen. The carrier plate 1 consists of material exhibiting poor thermal conductivity, preferably consisting of glass. The matrix plate 3 should consist of non-solderable material or, respectively, material which has been rendered non-solderable having approximately the same coefficient of expansion as the carrier plate 1. It is bonded to the carrier plate 1 with, for example, the assistance of epoxy adhesive 2 or with wafer wax. Matrix plates 3 fabricated of a material such as KOVAR or of ceramic have proven particularly advantageous.

The thickness of the matrix plate 3 including the adhesive layer 2 should advantageously be less than the minimum thickness of the individual chips 5 to be contacted such that the chips protrude above the top of the matrix plate 3 as seen in FIG. 1. Moreover, the mutual spacing of the recesses 4 in the matrix plate should be of such size that an unintentional contacting of neighboring chips 5 is reliably avoided.

Figure 2:
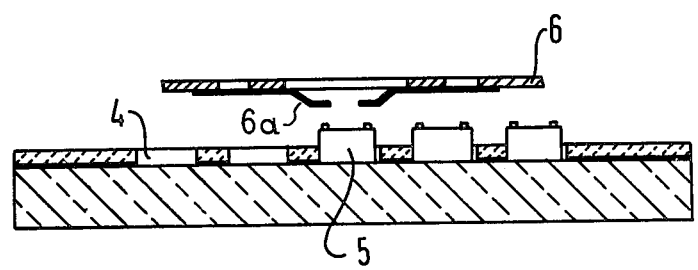
FIG. 2 is a schematic side sectional view showing the procedure of inner lead contacting.

FIG. 2 schematically shows the mutual positions of the carrier plate 1 with the matrix plate 3 and a film carrier 6 with terminal legs 6a for the inner lead contacting of the chips 5.

Figure 3:
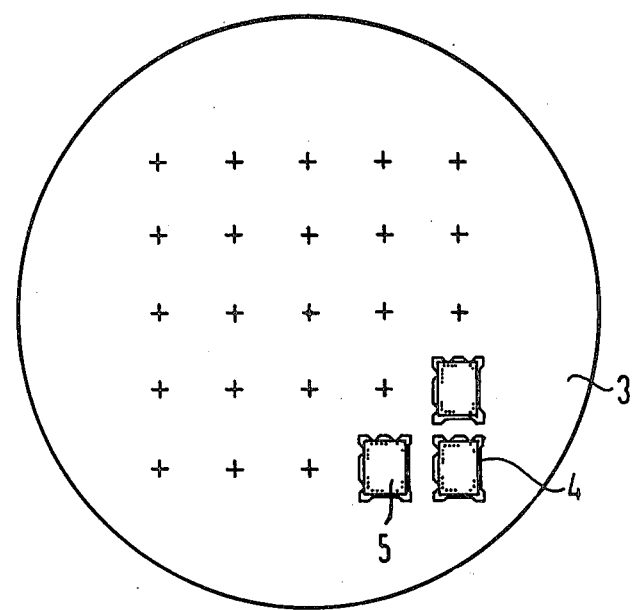
FIGS. 3 and 3a show the arrangement and design of the recesses in the matrix plate.
Figure 3A:
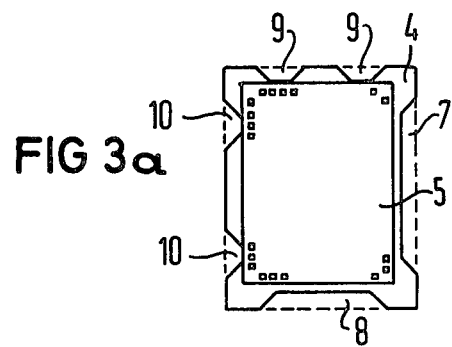
Figure 4:
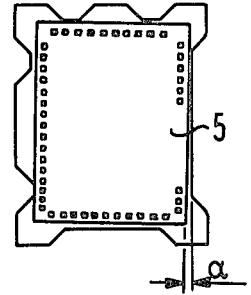
FIG. 4 is a partial plan view showing the position of a chip in a recess of the matrix plate.

FIG. 3 shows the plan view of an inventive device and, in particular, the plate 3 with the recesses 4 sized to receive the individual chips and being disposed matrix-like. It can be further seen in FIG. 3a that the recesses 4 are essentially rectangular with the trapezoidal projections 7, 8, 9 and 10 projecting inwardly from the edges. It has proven advantageous to provide only one respective projection 7, or respectively, 8, at one of the long sides and at one of the adjacent crosssides and to provide two respective projections 9 or, respectively, 10, at the two other sides of the recesses 4. The dimensions of the recesses 4 should be selected such that, on the one hand, the mechanical tolerances of the chips are taken into consideration and that, on the other hand, the different angular positions of the chips in the recess 4 thereby produced are not greater than that angular position which can be compensated at the automatic contacting machine by means of known angular position correction means (FIG. 4).

An additional advantage which can be achieved with the inventive method and the inventive device in comparison to the processing of entire wafers by presently available methods and devices is that the good chips from a plurality of wafers can be combined on a shared carrier plate 1 with a matrix plate 3. This is especially advantageous in that with large-surface, LSI and multi-poled circuits only a relatively small number of systems are usually disposed on one wafer and the yield per wafer is relatively low. This is also advantageous when the diameter of the wafer to be processed is lower than the maximum wafer diameter which can be processed with the automatic contacting machine. It is further advantageous that the automatic contacting machine need not be retooled between processing entire wafers and processing individual chips with the assistance of the inventive device.

As is apparent from the foregoing specification, the invention is susceptible of being embodied with various alterations and modification which may differ particularly from those that have been described in the preceding specification and description. For this reason, it is to be fully understood that all of the foregoing is intended to be merely illustrative and is not to be construed or interpreted as being restrictive or otherwise limited of the present invention, excepting as it is set forth and defined in the hereto appended claims.

I claim as my invention:

1. A device for processing individual integrated circuits (chips) into film-mounted integrated circuits (micropacks), comprising:
   a carrier plate having a very level planar upper surface and fabricated of a material exhibiting poor thermal conductivity, and
   a matrix plate secured to said upper surface and having recesses arranged matrix-like for receiving said chips,
   wherein said recesses are essentially rectangular having trapezoidal projections projecting inwardly from the edges for abutment with said chips.

2. A device for processing individual integrated circuits (chips) into film-mounted integrated circuits (micropacks), comprising:
   a carrier plate having a very level planar upper surface and fabricated of a material exhibiting poor thermal conductivity, and
   a matrix plate secured to said upper surface and having recesses arranged matrix-like for receiving said chips,
   the mutual lateral and longitudinal spacing of said recesses in said matrix plate is of such size that an unintentional contacting of neighboring chips is reliably avoided,
   wherein two trapezoidal projections for abuttment with said chips are provided at each side of said recesses.

3. A device for processing individual integrated circuits (chips) into film-mounted integrated circuits (micropacks), comprising:
   a carrier plate having a very level planar upper surface and fabricated of a material exhibiting poor thermal conductivity, and
   a matrix plate secured to said upper surface and having recesses arranged matrix-like for receiving said chips,
   the mutual lateral and longitudinal spacing of said recesses in said matrix plate is of such size that an unintentional contacting of neighboring chips is reliably avoided,
   wherein one respective projection is provided at one longitudinal side and at one of the adjacent cross-sides of the recesses and that two respective projections are provided at the two other sides of the recesses.

4. An installation for supporting several semi-conductor plates provided with integrated circuits during contacting with strip conductors developed on a film-type substrate, whereby the installatio includes a carrier plate on which the semi-conductor plates are arranged and fixed in a matrix-type arrangement in defined orientation and with a defined mutual distance through which an inadvertant contacting of adjacent semi-conductor plates is avoided with certainty comprising:
   said carrier plate having a highly level planar surface and consisting of material having poor thermal-conducting properties,
   said matrix-type arrangement provided by means of an additional plate mounted on a carrier plate,
   said additional plate having correspondingly arranged openings for accomodating said semi-conductor plates to be contacted,
      thickness of the additional plate being smaller than the minimal thickness of said semi-conductor plates to be contacted,
   said openings for the accomodation of said semi-conductor plates having a rectangular shape with trapezoidal projections extending inwardly therein, whereby fixation of the semi-conductor plates is accomplished through abutment with the trapezoidal projections.

5. The installation according to claim 4 wherein two trapezoidal projections for the purpose of aligning the semi-conductor chips are provided on each side of the openings.

6. The installation according to claim 4 wherein on one longitudinal side and on one of the adjacent transverse sides of said openings, one trapezoidal projection each is provided, and, on the other two sides of the openings, two projections each are provided.

7. The installation according to claim 4 wherein the carrier plate is glass.

8. The installation according to claim 4 wherein said additional plate consists of non-solderable material having approximately the same expansion coefficients as said carrier plate.

9. The installation according to claim 4 wherein said additional plate is cemented on said carrier plate by means of epoxy cement.

10. The installation according to claim 4 wherein said additional plate is cemented on said carrier plate by means of wafer wax.

11. The installation according to claim 4 wherein said additional plate is fabricated of Kovar.

12. The installation according to claim 4 wherein said additional plate is fabricated of ceramic.

* * * * *